United States Patent
Schaper

(10) Patent No.: US 9,755,406 B2
(45) Date of Patent: Sep. 5, 2017

(54) COMB-SHAPED INTERCONNECT OF A LOOPING BRIDGE FOR LOOPING A NUMBER OF ELECTRIC SIGNALS

(71) Applicant: Phoenix Contact GmbH & Co. KG, Blomberg (DE)

(72) Inventor: Elmar Schaper, Lügde (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 15/100,594

(22) PCT Filed: Dec. 4, 2014

(86) PCT No.: PCT/EP2014/076578
§ 371 (c)(1),
(2) Date: May 31, 2016

(87) PCT Pub. No.: WO2015/091001
PCT Pub. Date: Jun. 25, 2015

(65) Prior Publication Data
US 2016/0308334 A1 Oct. 20, 2016

(30) Foreign Application Priority Data

Dec. 20, 2013 (DE) .......................... 10 2013 114 651

(51) Int. Cl.
*H01R 12/00* (2006.01)
*H02B 1/20* (2006.01)
(Continued)

(52) U.S. Cl.
CPC ............. *H02B 1/205* (2013.01); *H01R 12/72* (2013.01); *H01R 12/79* (2013.01); *H01R 31/08* (2013.01);
(Continued)

(58) Field of Classification Search
CPC ........ H01R 12/00; H01R 12/59; H01R 12/72; H01R 12/79; H01R 12/52; H01R 12/62; H01R 12/716
(Continued)

(56) References Cited

U.S. PATENT DOCUMENTS 3,662,088 A    5/1972   Wright et al.
3,818,280 A *  6/1974   Smith ................ H01R 12/7005
                                                361/802
(Continued)

FOREIGN PATENT DOCUMENTS

DE    44 40 102 C1    5/1996
DE    19635825 A1     3/1998
(Continued)

OTHER PUBLICATIONS

ISA/EP International Search Report, Int'l Application No. PCT/EP2014/076578, Jun. 25, 2015, European Patent Office, Rijswijk, NL, 29 pgs.

*Primary Examiner* — Chandrika Prasad
(74) *Attorney, Agent, or Firm* — Holland & Hart LLP

(57) ABSTRACT

A looping bridge is disclosed for looping a number of electric signals through from a first electric module having a number of first electric terminals to a second electric module having a number of second electric terminals, said looping bridge comprising: a comb-shaped interconnect structure having a number of first comb teeth and a number of second comb teeth wherein the first comb teeth can be inserted into the first electric terminals and the second comb teeth can be inserted into the second electric terminals, and wherein the first comb teeth are electroconductively connected to the second comb teeth the comb-shaped interconnect structure being a comb-shaped circuit board.

18 Claims, 4 Drawing Sheets

(51) Int. Cl.
  *H01R 12/72* (2011.01)
  *H01R 31/08* (2006.01)
  *H05K 1/11* (2006.01)
  *H01R 12/79* (2011.01)
  *H01R 9/26* (2006.01)
  *H02G 5/00* (2006.01)
  *H05K 1/14* (2006.01)

(52) U.S. Cl.
  CPC ............ *H05K 1/117* (2013.01); *H05K 1/147* (2013.01); *H01R 9/2675* (2013.01); *H02G 5/005* (2013.01); *H05K 1/148* (2013.01); *H05K 2201/09163* (2013.01); *H05K 2201/09172* (2013.01)

(58) Field of Classification Search
  USPC .............................................. 439/62, 67, 69
  See application file for complete search history.

(56) References Cited

U.S. PATENT DOCUMENTS

| | | | | |
|---|---|---|---|---|
| 4,968,260 | A * | 11/1990 | Ingalsbe | H04Q 1/028 439/638 |
| 7,351,085 | B2 * | 4/2008 | Tamagawa | H01R 12/592 439/189 |
| 7,476,113 | B2 * | 1/2009 | Tamagawa | H01R 12/592 439/189 |
| 2003/0076650 | A1 | 4/2003 | Momota | |
| 2003/0096517 | A1 * | 5/2003 | Ho | H01R 12/7029 439/79 |
| 2005/0106903 | A1 * | 5/2005 | Tamagawa | H01R 12/592 439/67 |
| 2006/0105622 | A1 * | 5/2006 | Nakano | H01R 12/771 439/495 |
| 2006/0286826 | A1 * | 12/2006 | Tamagawa | H01R 12/592 439/67 |
| 2007/0015417 | A1 | 1/2007 | Caveney et al. | |

FOREIGN PATENT DOCUMENTS

| | | |
|---|---|---|
| DE | 298 02 047 U1 | 8/1998 |
| DE | 102004034396 A1 | 2/2005 |
| DE | 10 2004 002 077 A1 | 8/2005 |
| DE | 102004002077 A1 | 8/2005 |
| EP | 1172908 A2 | 1/2002 |
| GB | 2 035 716 A | 6/1980 |
| JP | 2009076300 A | 4/2009 |

\* cited by examiner

COMB-SHAPED INTERCONNECT OF A LOOPING BRIDGE FOR LOOPING A NUMBER OF ELECTRIC SIGNALS

CROSS-REFERENCE TO RELATED APPLICATIONS

The present application is a 373 national phase filing of International Application No. PCT/EP2014/076578, entitled "Looping Bridge for Looping through a Number of Electric Signals", filed 4 Dec. 2014, which claims priority to German Patent Application No. 10 2013 114 651.1, entitled "Schleifenbrücke zum Durchschleifen einer Anzahl von elektrischen Signalen", filed 20 Dec. 2013.

BACKGROUND

The present invention relates to a looping bridge for looping through a number of electric signals.

For transmitting electric signals, for example a supply voltage, to electric terminals of an electric module, connecting lines, for example insulated copper wires having a cross sectional area of 1.5 mm$^2$, are frequently used. To loop one of the electric signals through to an electric terminal of another electric module, frequently one end section of each of two connecting lines is inserted into a connecting device, for example into a double core end sleeve in order to electrically connect the connecting lines. Electrically contacting the connecting device to an electric terminal of the electric module thus enables one of the electric signals to be looped through to an electric terminal of the other electric module.

However, inserting the end sections of the connecting lines into the connecting device is complex and time-consuming, particularly when a multiplicity of electric signals will be looped through to electric terminals of a plurality of additional electric modules. A prefabricated looping bridge can be used for this purpose, by means of which the electric signals can be looped through to electric terminals of a fixed number of electric modules. To enable the electric signals to be looped through to electric terminals of additional electric modules, the prefabricated looping bridge can be lengthened in a complex process by means of connecting lines. For example, two prefabricated looping bridges can be electrically connected to one another for this purpose in a complex process by means of wire lines.

SUMMARY

The object of the present disclosure is to provide an efficient looping bridge for looping electric signals through multiple electrical modules.

This object is attained by subjects having the features according to the independent claims. Advantageous examples of the principles of this disclosure are the subject matter of the figures, the description and the dependent claims.

The invention is based on the realization that an efficient looping bridge can be attained by a flat interconnect structure, which can periodically be extended laterally.

According to a first set of examples, the object is attained by a looping bridge for looping a number of electric signals through from a first electric module having the number of first electric terminals to a second electric module having the number of second electric terminals, comprising: a comb-shaped interconnect structure having the number of first comb teeth and the number of second comb teeth, wherein the first comb teeth can be inserted into the first electric terminals and the second comb teeth can be inserted into the second electric terminals, and wherein the first comb teeth are electroconductively connected to the second comb teeth. This results in the technical advantage, for example, of a looping bridge that can be assembled efficiently for looping through a number of electric signals.

The number of electric signals can be a whole number. For example, the number is 1, 2, 3, 4, 5, 10 or 25. The number can further correspond to a pole number of number of poles.

The electric signals can be control signals for controlling the respective electric modules. The electric signals can also be phase signals of a polyphase signal. For example, the polyphase signal may be a polyphase supply voltage.

The respective electric module can be a control module for a device, for example a hybrid motor starter and/or a motor manager.

The respective electric module can further comprise or be an electric connecting module, in particular a terminal block.

The respective electric terminals can be connecting terminals of the respective electric module.

The comb-shaped interconnect structure can be embodied as a comb-shaped circuit board or a comb-shaped lead frame. The comb-shaped interconnect structure can also be a specially designed connecting circuit board or a circuit board.

In one advantageous example of the looping bridge, the first comb teeth are each electroconductively connected to the second comb teeth in pairs, so that in each case one of the first comb teeth is electroconductively connected to one of the second comb teeth. This results in the technical advantage, for example, that the number of electric signals can be looped through efficiently from the first electric module to the second electric module.

In a further advantageous example of the looping bridge, the comb teeth are rectangular or rounded. This results in the technical advantage, for example, that the comb teeth can be inserted efficiently into the respective electric terminals.

In a further example of the looping bridge, the first comb teeth and/or the second comb teeth are electrically insulated relative to one another.

In a further advantageous example of the looping bridge, each of the comb teeth has an electric contact surface for contacting an electric terminal. This results in the technical advantage, for example, that the comb teeth can be electrically contacted in an efficient manner with the respective electric terminals.

The electric contact surface can be embodied as a copper layer located on the comb-shaped interconnect structure. The electric contact surface can also be a terminal pad.

In a further advantageous example of the looping bridge, adjacent comb teeth are spaced by a recess, in particular by a rectangular or rounded recess, which is embodied to receive a housing crosspiece of the respective electric module between two adjacent electric terminals. This results in the technical advantage, for example, that the respective comb teeth can be inserted into the electric terminals of the respective electric module forming a positive connection.

The recess can further be embodied to receive the housing of the respective electric module between two adjacent electric terminals.

The comb-shaped interconnect structure or the circuit board can further project downward into the electric terminals of the respective electric module or the connecting terminal forming a positive connection.

In a further advantageous example of the looping bridge, the comb-shaped interconnect structure is embodied as a comb-shaped circuit board. The technical advantage is thereby achieved, for example, that the comb-shaped interconnect structure can be formed in an efficient manner.

In a further advantageous example of the looping bridge, the comb-shaped circuit board has a plurality of circuit board layers, wherein between every two successive circuit board layers, an electric line for electrically contacting one of the first comb teeth to one of the second comb teeth is provided. The technical advantage is thereby achieved, for example, that one of the first comb teeth can be electrically connected in an efficient manner to one of the second comb teeth.

In a further advantageous example of the looping bridge, the comb-shaped circuit board has a flexible circuit board section, which flexibly connects a first circuit board section, which comprises the first comb teeth, to a second circuit board section, which comprises the second comb teeth. The technical advantage is thereby achieved, for example, that any difference in height between the first electric module and the second electric module can be compensated for.

The flexible circuit board section can be embodied or implemented as a flex circuit board. The flexible circuit board section can also be designed to compensate for vibrations in the respective electric module.

In a further advantageous example of the looping bridge, the flexible circuit board section is compression molded to the first circuit board section and the second circuit board section. The technical advantage is thereby achieved, for example, that the respective circuit board sections can be connected to one another in an efficient manner.

In a further advantageous example of the looping bridge, the flexible circuit board section is embodied as S-shaped or U-shaped. The technical advantage is thereby achieved, for example, that the length of the looping bridge can be adapted to the distance between the first electric module and the second electric module.

In a further advantageous example of the looping bridge, the comb-shaped interconnect structure is embodied as a lead frame. The technical advantage is thereby achieved, for example, that the comb-shaped interconnect structure can be formed in an efficient manner.

The lead frame can be a metallic stamped part or etched part. The lead frame can also be embodied as comprising a plurality of layers, in sandwich form for example, in which case the layers are all insulated relative to one another by insulating films.

In a further advantageous example of the looping bridge, the bridge comprises an additional comb-shaped interconnect structure having additional comb teeth, wherein at least a part of the additional comb-shaped interconnect structure can be placed on top of the comb-shaped interconnect structure, thereby electrically contacting comb teeth of the comb-shaped interconnect structure with comb teeth of the additional comb-shaped interconnect structure in pairs. The technical advantage is thereby achieved, for example, that the looping bridge can be lengthened in an efficient manner to allow the number of electric signals to be looped through to additional electric modules.

The additional comb-shaped interconnect structure can be identical in configuration to the comb-shaped interconnect structure.

In a further advantageous example of the looping bridge, each of the comb teeth has an electric contact surface on its upper side and one on its lower side, for electrically contacting an electric terminal or a comb tooth of the additional comb-shaped interconnect structure. The technical advantage is thereby achieved, for example, that the looping bridge can be assembled easily.

In a further advantageous example of the looping bridge, the electric signals are phase signals of a polyphase signal. The technical advantage is thereby achieved, for example, that a polyphase supply voltage can be looped through from the first electric module to the second electric module in an efficient manner.

According to a second set of examples, the object is attained by a connector assembly for looping through a number of electric signals, said assembly comprising: a first electric module having the number of first electric terminals; a second electric module having the number of second electric terminals; and the looping bridge, which comprises a comb-shaped interconnect structure having the number of first comb teeth and the number of second comb teeth; wherein the first comb teeth are inserted into the first electric terminals and the second comb teeth are inserted into the second electric terminals, thereby electroconductively connecting the first electric terminals to the second electric terminals, each in pairs, so that in each case, one of the first electric terminals is electroconductively connected to one of the second electric terminals. The technical advantage is thereby achieved, for example, that the number of electric signals can be looped through in an efficient manner from the first electric module to the second electric module.

In addition, each electric module can comprise or can be an electric connecting module, in particular a terminal block.

BRIEF DESCRIPTION OF THE DRAWINGS

Examples of the invention are illustrated in the set of drawings, in which.

DETAILED DESCRIPTION

Figure 1:
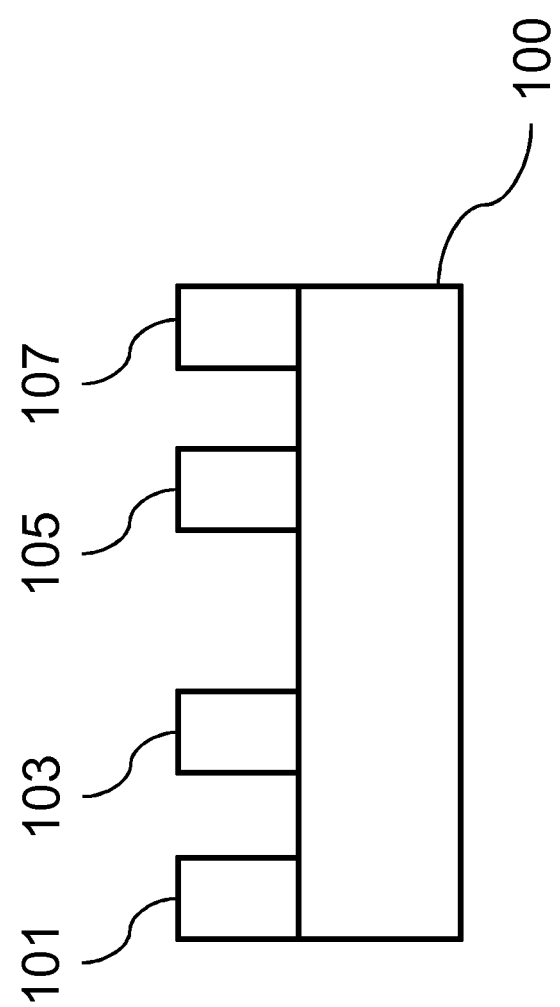
FIG. 1 shows an example of a looping bridge having a comb-shaped interconnect structure.

FIG. 1 shows a looping bridge comprising a comb-shaped interconnect structure 100 according to one embodiment. Comb-shaped interconnect structure 100 has comb teeth 101 to 107. Comb-shaped interconnect structure 100 is used in the looping bridge for looping through one or more electric signals.

The looping bridge for looping a number of electric signals through from a first electric module having the number of first electric terminals to a second electric module having the number of second electric terminals comprises or uses the comb-shaped interconnect structure 100 having the number of first comb teeth 101, 103 and the number of second comb teeth 105, 107, for example, wherein the first comb teeth 101, 103 can be inserted into the first electric terminals, wherein the second comb teeth 105, 107 can be inserted into the second electric terminals, and wherein the first comb teeth 101, 103 are electroconductively connected to the second comb teeth 105, 107.

The number of electric signals can be a whole number. For example, the number may be 1, 2, 3, 4, 5, 10 or 25. The number can further correspond to a pole number of number of poles.

The electric signals can be control signals for controlling the respective electric modules. The electric signals can further be phase signals of a polyphase signal. The polyphase signal may be a polyphase supply voltage, for example.

The respective electric module can be a control module for a device, for example a hybrid motor starter and/or a motor manager.

Each electric module can further comprise or be an electric connecting module, in particular a terminal block.

The respective electric terminals can be connecting terminals of the respective electric module.

Comb-shaped interconnect structure 100 can be embodied as a comb-shaped circuit board or a comb-shaped lead frame. Comb-shaped interconnect structure 100 can also be a specially designed connecting circuit board or circuit board.

Figure 2:
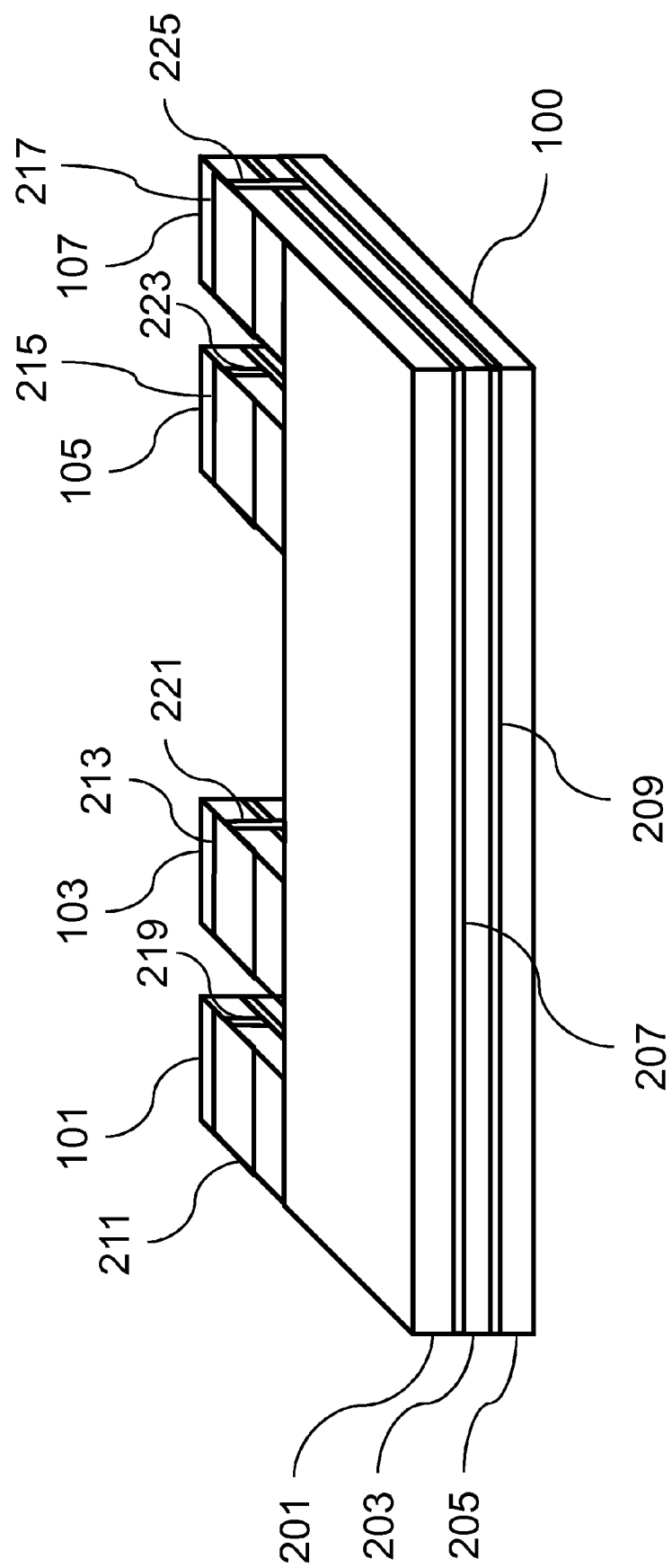
FIG. 2 shows an example of a looping bridge having the comb-shaped interconnect structure with a plurality of circuit board layers.

FIG. 2 shows an embodiment of the looping bridge comprising the comb-shaped interconnect structure 100 having a plurality of circuit board layers. Comb-shaped interconnect structure 100 comprises comb teeth 101 to 107, circuit board layers 201 to 205, conducting layers 207 and 209, contact surfaces 211 to 217 and contacts 219 to 225. Comb-shaped interconnect structure 100 is used in the looping bridge for looping through one or more electric signals.

Comb-shaped interconnect structure 100 can be embodied as a multilayer circuit board. In this case, comb-shaped interconnect structure 100 has a plurality of circuit board layers 201, 203, 205, and has a conducting layer 207, 209 having an electric line for electrically contacting one of the first comb teeth 101, 103 to one of the second comb teeth 105, 107, which conducting layer is arranged between every two successive circuit board layers 201, 203, 205.

Contact surfaces 211 to 217 are arranged on circuit board layer 201 and are at least partially coated with metal, for example.

Contact surface 211 is electrically connected via contact 219 to conducting layer 207. In addition, contact surface 215 is electrically connected via contact 223 to conducting layer 207. Comb tooth 101 is thereby electrically contacted to comb tooth 105.

Contact surface 213 is electrically connected via contact 221 to conducting layer 209. In addition, contact surface 217 is electrically connected via contact 225 to conducting layer 209. Comb tooth 103 is thereby electrically contacted to comb tooth 107.

Circuit board layer 203 insulates conducting layer 207 electrically from conducting layer 209.

Comb-shaped circuit board 100 is embodied as electrically insulated in sections on both sides by circuit board layers 201 and 205, to facilitate installation of the comb-shaped circuit board 100.

Figure 3:
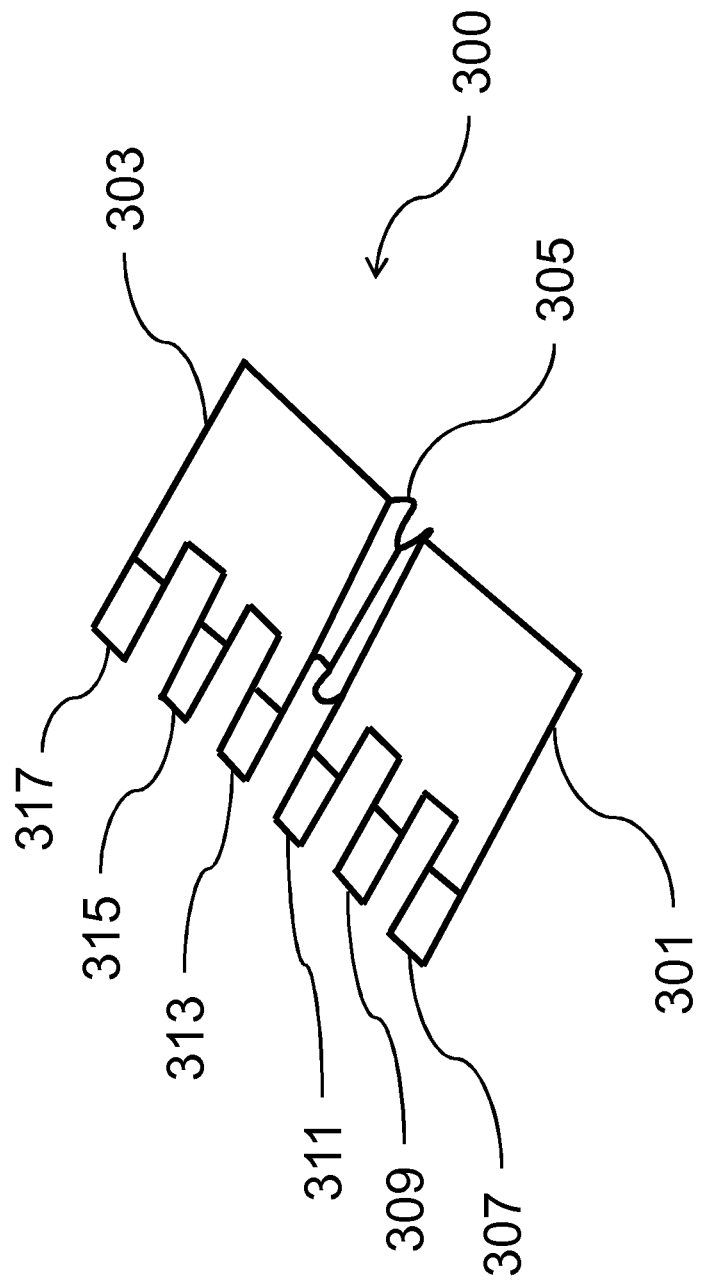
FIG. 3 shows an example of a looping bridge having a comb-shaped interconnect structure with a flexible circuit board section.

FIG. 3 shows a looping bridge comprising a comb-shaped interconnect structure 300 having a flexible circuit board section 305, according to one embodiment. Comb-shaped interconnect structure 300 further comprises a first circuit board section 301, a second circuit board section 303 and comb teeth 307 to 317. Comb-shaped interconnect structure 300 is used in the looping bridge for looping through one or more electric signals.

Comb-shaped interconnect structure 300 is formed by a comb-shaped circuit board that has flexible circuit board section 305, which flexibly connects first circuit board section 301, which comprises the first comb teeth 307, 309, 311, to second circuit board section 303, which comprises the second comb teeth 313, 315, 317.

Flexible circuit board section 305 can be embodied or implemented as a flex circuit board. Flexible circuit board section 305 can further be embodied to compensate for vibrations in the respective electric module. In addition, flexible circuit board section 305 can be compression molded to first circuit board section 301 and second circuit board section 303. The flexible circuit board section may also be embodied as S-shaped or U-shaped.

Figure 4:
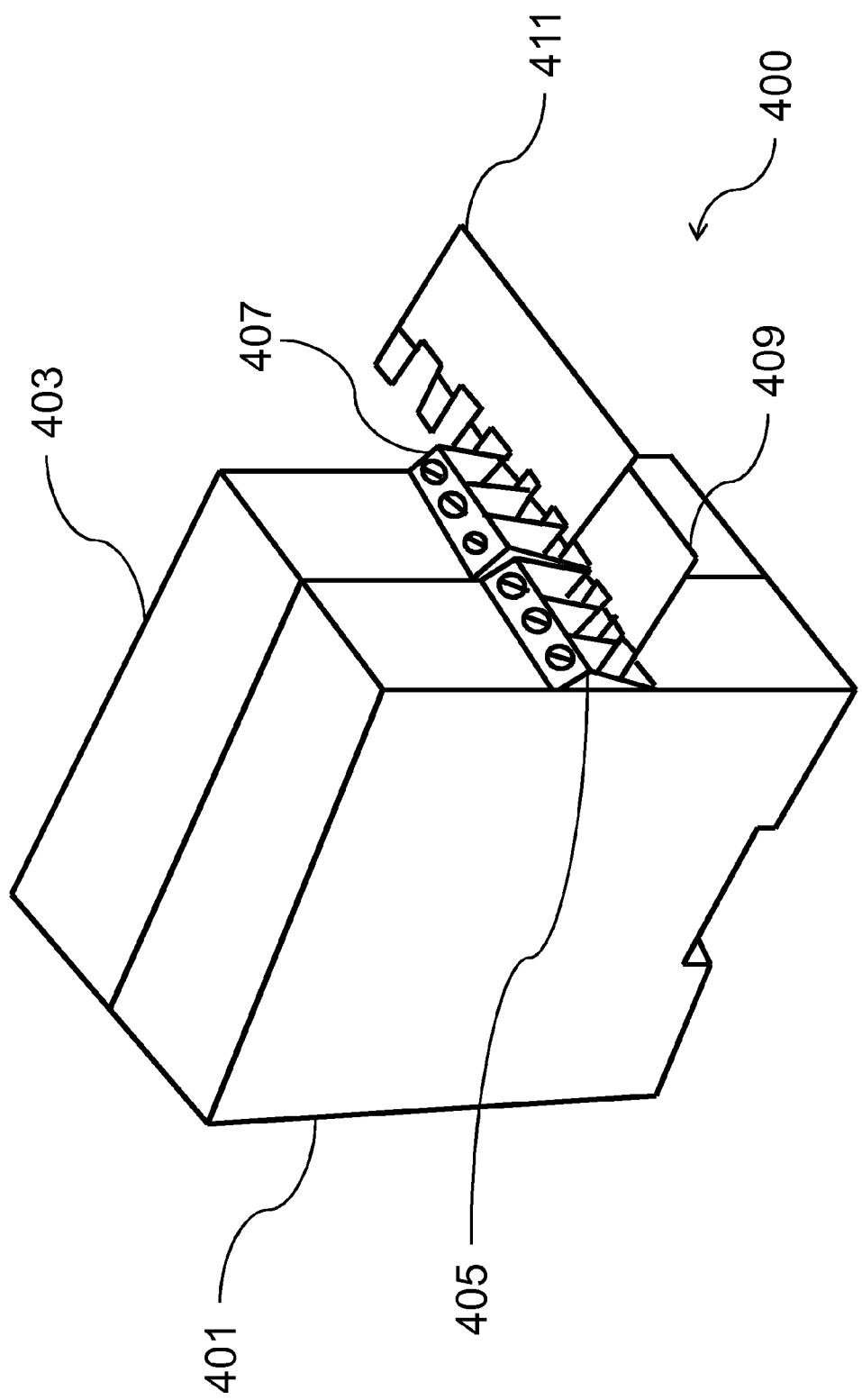
FIG. 4 shows an example of a connector assembly.

FIG. 4 shows a connector assembly 400 according to one embodiment. Connector assembly 400 comprises a first electric module 401, a second electric module 403, connecting terminals 405 and 407, a comb-shaped interconnect structure 409 and an additional comb-shaped interconnect structure 411. Comb-shaped interconnect structure 409 and additional comb-shaped interconnect structure 411 are used in the looping bridge for looping through one or more electric signals.

Connector assembly 400 for looping through a number of electric signals comprises the first electric module 401 having the number of first electric terminals; the second electric module 403 having the number of second electric terminals; and a looping bridge, which comprises comb-shaped interconnect structure 409 having the number of first comb teeth and the number of second comb teeth; wherein the first comb teeth are inserted into the first electric terminals and the second comb teeth are inserted into the second electric terminals, thereby electroconductively connecting the first electric terminals to the second electric terminals in pairs, so that each electric terminal of the first electric terminals is electroconductively connected to an electric terminal of the second electric terminals.

The number of electric signals can be a whole number. For example, the number can be 1, 2, 3, 4, 5, 10 or 25. The number can further correspond to a pole number of number of poles.

The electric signals can be control signals for controlling the respective electric modules 401, 403. The electric signals can further be phase signals of a polyphase signal. For example, the polyphase signal may be a polyphase supply voltage.

The respective electric module 401, 403 can be a control module for a device, for example a hybrid motor starter and/or a motor manager.

The respective electric module 401, 403 can further comprise or be an electric connecting module, in particular a terminal block.

Connecting terminals 405 comprise the first electric terminals, and connecting terminals 407 comprise the second electric terminals.

An additional comb-shaped interconnect structure 411 having additional comb teeth is also provided, wherein portions of additional comb-shaped interconnect structure 411 are placed on top of comb-shaped interconnect structure 409, thereby electrically contacting comb teeth of comb-shaped interconnect structure 409 with comb teeth of the additional comb-shaped interconnect structure 411, in pairs.

Additional comb-shaped interconnect structure 411 can be identical in configuration to comb-shaped interconnect structure 409.

According to one embodiment, a comb-shaped interconnect structure 100 or a specially designed connecting circuit board can be used to replace a connecting line.

According to one embodiment, the comb-shaped interconnect structure 100 or the circuit board can project downward into the connecting terminal forming a positive connection.

According to one embodiment, two comb-shaped interconnect structures 100 or circuit board combs can lie one on top of the other over half their length.

According to one embodiment, contact surfaces 211, 213, 215, 217 or the terminal pads are formed on both sides.

According to one embodiment, the contact surfaces of comb-shaped interconnect structure 100 can contact the contact surfaces of the additional comb-shaped structure 411 or can contact the surfaces when the connecting terminals 407 or the connecting terminal is screw connected.

According to one embodiment, comb-shaped interconnect structure 100 can be implemented as a circuit board or flex circuit board.

According to one embodiment, comb-shaped interconnect structure 100 has a low installation depth, is inexpensive and requires a short assembly time, is compact, can have any number of devices and is not prefabricated.

According to one embodiment, one section of comb-shaped interconnect structure 300, such as flexible circuit board section 305 or the center part, can be embodied as flexible, to enable compensation for vibrations and for discrepancies in length.

According to one embodiment, flexible circuit board section 305 or the center part can be S-shaped or U-shaped.

According to one embodiment, comb-shaped interconnect structure 100 is formed by a type of lead frame, with which the connection between the respective electric modules 401, 403 is established.

According to one embodiment, the lead frame can be embodied as having multiple layers in a sandwich form.

According to one embodiment, all the layers can be insulated from one another by insulating films.

All features described and illustrated in connection with individual embodiments may be provided in different combinations in the subject matter according to the invention, in order to achieve the advantageous effects thereof simultaneously.

The scope of protection of the present invention is determined by the claims and is not restricted by the features specified in the description or illustrated in the figures.

LIST OF REFERENCE SIGNS 100 comb-shaped interconnect structure
101 comb tooth
103 comb tooth
105 comb tooth
107 comb tooth
201 circuit board layer
203 circuit board layer
205 circuit board layer
207 conducting layer
209 conducting layer
211 contact surface
213 contact surface
215 contact surface
217 contact surface
219 contact
221 contact
223 contact
225 contact
300 comb-shaped interconnect structure
301 first circuit board section
303 second circuit board section
305 flexible circuit board section
307 comb tooth
309 comb tooth
311 comb tooth
313 comb tooth
315 comb tooth
317 comb tooth
400 connector assembly
401 first electric module
403 second electric module
405 connecting terminal
407 connecting terminal
409 comb-shaped interconnect structure
411 additional comb-shaped interconnect structure

What is claimed is:

1. A looping bridge for looping a number of electric signals from a first electric module having a number of first electric terminals to a second electric module having a number of second electric terminals, said looping bridge comprising:
   a comb-shaped interconnect structure having a number of first comb teeth and a number of second comb teeth, wherein the first comb teeth can be inserted into the first electric terminals and the second comb teeth can be inserted into the second electric terminals, and wherein the first comb teeth are electroconductively connected to the second comb teeth;
   wherein the comb-shaped interconnect structure is formed by a comb-shaped circuit board, wherein the comb-shaped circuit board has a plurality of circuit board layers, and an electric line configured to electrically connect one of the first comb teeth with one of the second comb teeth is positioned between every two successive circuit board layers; and
   an additional comb-shaped interconnect structure having additional comb teeth, wherein at least a portion of the additional comb-shaped interconnect structure is configured to be placed on top of the comb-shaped interconnect structure to electrically connect comb teeth of the comb-shaped interconnect structure with comb teeth of the additional comb-shaped interconnect structure in pairs.

2. The looping bridge according to claim 1, wherein the first comb teeth are electroconductively connected in pairs to the second comb teeth, wherein each one of the first comb teeth is electroconductively connected to one of the second comb teeth.

3. The looping bridge according to claim 1, wherein the comb teeth are rectangular or rounded.

4. The looping bridge according to claim 1, wherein each of the comb teeth has an electric contact surface for contacting an electric terminal.

5. The looping bridge according to claim 1, wherein:
   adjoining ones of the first comb teeth are spaced from one another by a first recess configured to receive a housing crosspiece of the first electric module between two adjoining ones of the first electric terminals; and
   adjoining ones of the second comb teeth are spaced from one another by a second recess configured to receive a housing crosspiece of the second electric module between two adjoining ones of the second electrical terminals.

6. The looping bridge according to claim 1, wherein the first comb teeth are electrically insulated relative to one another and the second comb teeth are electrically insulated relative to one another.

7. The looping bridge according to claim 1, wherein the comb-shaped circuit board has a flexible circuit board section which flexibly connects a first circuit board section to a second circuit board section, wherein the first circuit board section comprises the first comb teeth and the second circuit board section comprises the second comb teeth.

8. The looping bridge according to claim 7, wherein the flexible circuit board section is compression molded to the first circuit board section and the second circuit board section.

9. The looping bridge according to claim 7, wherein the flexible circuit board section is S-shaped or U-shaped.

10. The looping bridge according to claim 1, wherein each of the comb teeth has a first electric contact surface on an upper side and a second electric contact surface on a lower side.

11. The looping bridge according to claim 1, wherein the electric signals are phase signals of a polyphase signal.

12. A connector assembly for looping through a number of electric signals, comprising:
   a first electric module comprising a first terminal block having a number of first electric terminals;
   a second electric module comprising a second terminal block having a number of second electric terminals; and
   a looping bridge comprising a first comb-shaped interconnect structure and a second comb-shaped interconnect structure, the first comb-shaped interconnect structure having a number of first comb teeth and a number of second comb teeth, and the second comb-shaped interconnect structure having a number of third comb teeth;
   wherein the first comb teeth are electroconductively connected to the second comb teeth;
   wherein the first comb-shaped interconnect structure is formed by a comb-shaped circuit board, the comb-shaped circuit board has a plurality of circuit board layers, and an electric line configured to electrically connect one of the first comb teeth with one of the second comb teeth is positioned between every two successive circuit board layers;
   wherein the first comb teeth are inserted into the first electric terminals and the second comb teeth are inserted into the second electric terminals, thereby electroconductively connecting the first electric terminals with the second electric terminals in pairs, so that in each case, one of the first electric terminals is electroconductively connected to one of the second electric terminals; and
   wherein the second comb-shaped interconnect structure is configured to be placed on top of the first comb-shaped interconnect structure to electrically connect comb teeth of the first comb-shaped interconnect structure with comb teeth of the second comb-shaped interconnect structure in pairs.

13. The connector assembly of claim 12, wherein the first comb teeth are electroconductively connected in pairs to the second comb teeth, wherein each one of the first comb teeth is electroconductively connected to one of the second comb teeth.

14. The connector assembly of claim 12, wherein each of the comb teeth has an electric contact surface for contacting an electrical terminal.

15. The connector assembly of claim 12, wherein:
   adjoining ones of the first comb teeth are spaced from another by a first recess configured to receive a housing crosspiece of the first electric module between two adjoining ones of the first electrical terminals; and
   adjoining ones of the second comb teeth are spaced from one another by a second recess configured to receive a housing crosspiece of the second electric module between two adjoining ones of the second electrical terminals.

16. The connector assembly of claim 12, wherein the first comb teeth are electrically insulated relative to one another and the second comb teeth are electrically insulated relative to one another.

17. The connector assembly of claim 12, wherein the first comb-shaped circuit board has a flexible circuit board section which flexibly connects a first circuit board section to a second board section, wherein the first circuit board section comprises the first comb teeth and the second circuit board section comprises the second comb teeth.

18. The connector assembly of claim 17, wherein the flexible circuit board section is compression molded to the first circuit board section and the second circuit board section.

* * * * *